(12) United States Patent
Quinlan et al.

(10) Patent No.: US 8,373,249 B2
(45) Date of Patent: *Feb. 12, 2013

(54) PROGRAMMABLE CAPACITOR ASSOCIATED WITH AN INPUT/OUTPUT PAD

(75) Inventors: Sion C. Quinlan, Goring on Thames (GB); Bryan Almond, Windsor (GB); Ken S. Hunt, Finchampstead (GB); Andrew M. Lever, Old Woking (GB); Joe A. Ward, Swindon (GB)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 13/012,599

(22) Filed: Jan. 24, 2011

(65) Prior Publication Data

US 2011/0117716 A1    May 19, 2011

Related U.S. Application Data

(60) Continuation of application No. 12/564,534, filed on Sep. 22, 2009, now Pat. No. 7,879,649, which is a division of application No. 10/230,795, filed on Aug. 29, 2002, now Pat. No. 7,602,039.

(51) Int. Cl.
*H01L 29/00* (2006.01)
*H01L 23/34* (2006.01)

(52) U.S. Cl. ........ 257/529; 257/724; 257/786; 257/732; 257/E23.144

(58) Field of Classification Search .................. 257/529, 257/532, 535, 724, 786, E23.144
See application file for complete search history.

(56) References Cited

U.S. PATENT DOCUMENTS

| | | | |
|---|---|---|---|
| 4,654,689 A | 3/1987 | Fujii | 357/51 |
| 4,952,997 A | 8/1990 | Sugiyama et al. | 357/40 |
| 5,185,689 A | 2/1993 | Maniar | 361/313 |
| 5,401,989 A | 3/1995 | Kikuchi | 257/211 |
| 6,281,564 B1 | 8/2001 | Richiuso | 257/532 |
| 6,404,615 B1 | 6/2002 | Wijeyesekera et al. | 361/306.1 |
| 6,794,098 B1 | 9/2004 | Kubacki | 430/9 |
| 7,602,039 B2 | 10/2009 | Quinlan et al. | 257/529 |
| 2001/0020743 A1 | 9/2001 | Eldridge et al. | 257/737 |
| 2002/0197844 A1 | 12/2002 | Johnson et al. | 438/618 |
| 2010/0009511 A1 | 1/2010 | Quinlan et al. | 438/396 |

FOREIGN PATENT DOCUMENTS

EP     0457013 A2    11/1991

OTHER PUBLICATIONS

Anderson, Gonzales, Knecht and Fowler; "ESD Protection Under Wire Bonding Pads"; ESO/Symposium 99-98 thru 99-94 (1999).

*Primary Examiner* — David Zarneke
(74) *Attorney, Agent, or Firm* — Dorsey & Whitney LLP

(57) ABSTRACT

The present invention provides a method and apparatus for a programmable capacitor associated with an input/output pad in the semiconductor device. The apparatus includes a semiconductor die having an upper surface, a first capacitor deployed above the upper surface of the semiconductor die, a separation layer deployed above the first capacitor, and a bond pad deployed above the separation layer such that at least a portion of the bond pad lies above the first capacitor.

25 Claims, 5 Drawing Sheets

PROGRAMMABLE CAPACITOR ASSOCIATED WITH AN INPUT/OUTPUT PAD

CROSS REFERENCE TO RELATED APPLICATIONS

This application is a continuation of U.S. patent application Ser. No. 12/564,534, filed Sep. 22, 2009, and issued as U.S. Pat. No. 7,879,649 on Feb. 1, 2011, which is a divisional of U.S. patent application Ser. No. 10/230,795 filed Aug. 29, 2002 and issued as U.S. Pat. No. 7,602,039 B2 on Oct. 13, 2009. These applications and patent are each incorporated herein by reference, in their entirety, for any purpose.

FIELD OF THE INVENTION

This invention relates generally to a semiconductor device, and, more particularly, to a programmable capacitor associated with an input/output pad in the semiconductor device.

DESCRIPTION OF THE RELATED ART

Traditional semiconductor devices are formed in a die that includes hundreds or thousands of individual semiconductor components such as transistors, memory elements, and the like. The die is generally formed of multiple layers of semiconductor material, such as silicon dioxide, and the various components are formed in the semiconductor layers and linked by electrically conducting lines or vias. For example, a transistor may be formed in the semiconductor material by well-known processes including etching, deposition, implantation, thermal growing, and the like.

The die also includes one or more bond pads formed around the perimeter of an upper surface of the die. The bond pads are used to couple the semiconductor device to external electrical circuits. By linking the bond pads to the other components on the die by electrically conducting lines or vias, signals may be transmitted between the external electrical circuits and the components on the die. For example, the bond pads may be coupled to input/output (I/O) driver circuits formed in the die, and the I/O driver circuits may provide various signals to electrical circuits coupled to the bond pads.

Portions of the die near the bond pad may be subject to a variety of stresses, including mechanical stresses, thermal stresses and the like, when the bond pads are formed. These stresses may damage active circuitry and metal components that are near the bond pad. Consequently, typical bond pad design rules dedicate a selected volume of the die to the bond pad. According to these rules, no metal or active components unrelated to the bond pad may be formed in the bond pad volume. Although the size of typical semiconductor components has steadily decreased, and the density of components that may be formed on the die has increased, the selected bond pad volume has remained nearly constant. Thus, the bond pad volume now occupies a larger portion of the die, both in real and relative terms, causing a reduction in the volume of the die that is available for active circuitry and metal components.

SUMMARY OF THE INVENTION

In one aspect of the instant invention, an apparatus is provided for a programmable capacitor associated with an input/output pad in the semiconductor device. The apparatus includes a semiconductor die having an upper surface, a first capacitor deployed above the upper surface of the semiconductor die, a separation layer deployed above the first capacitor, and a bond pad deployed above the separation layer such that at least a portion of the bond pad lies above the first capacitor.

In one aspect of the present invention, a method is provided for forming a programmable capacitor associated with an input/output pad in the semiconductor device. The method includes forming a first capacitor above a semiconductor substrate, forming a separation layer above the first capacitor, and forming a bond pad above the separation layer such that at least a portion of the bond pad lies above the first capacitor.

BRIEF DESCRIPTION OF THE DRAWINGS

The invention may be understood by reference to the following description taken in conjunction with the accompanying drawings, in which like reference numerals identify like elements, and in which.

Figure 1:
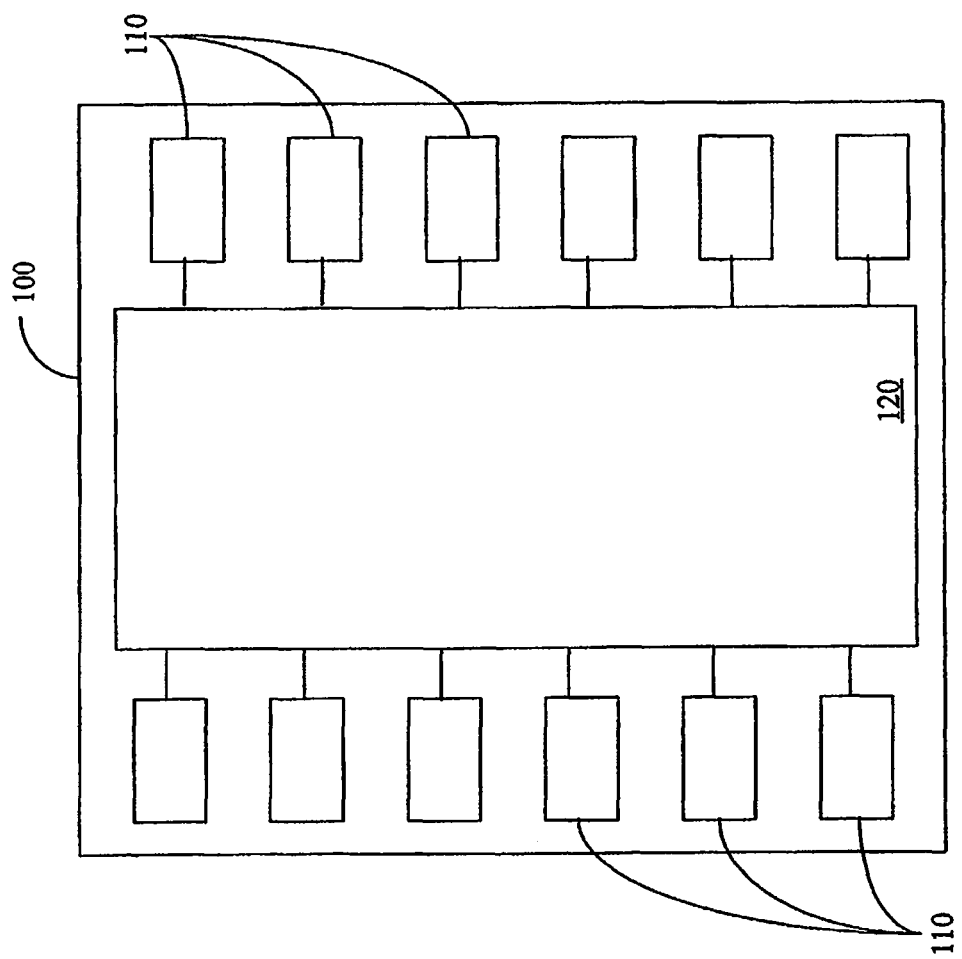
FIG. 1 shows a prior art block diagram illustrating a die.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Referring now to FIG. 1, a block diagram illustrating one exemplary embodiment of a semiconductor die 100 is shown. A plurality of bond pads 110 are deployed on the semiconductor die 100 and coupled to an internal circuit 120. Although twelve bond pads 110 are shown in FIG. 1, the present invention is not so limited. The number of bond pads 110 is a matter of design choice and is not material to the present invention. In alternative embodiments, more or fewer bond pads 110 may be deployed without departing from the scope of the present invention.

The internal circuit 120 generally includes a variety of electrical components (not shown), including, but not limited to, transistors, memory elements, resistors, capacitors, vial, and the like. For example, as discussed in more detail below, the internal circuit 120 may include a plurality of I/O drivers (see, e.g., the I/O driver 400 depicted in FIG. 4) that are coupled to the bond pads 110. In one embodiment, the bond pad 110 is also coupled to one or more capacitors (see, e.g., FIG. 2A) to control the slew rate of the I/O drivers. Depending on the application, it may be desirable to provide more than one capacitor, or a capacitor with a variable capacitance, to control the I/O device slew rate. Thus, in accordance with one embodiment of the present invention, a programmable capacitor (see, e.g., FIG. 4) may be provided.

As discussed above, advances in semiconductor die fabrication technology have decreased the typical size of the components of the internal circuit 120, and increased the density of components that may be formed on the semiconductor die 100. However, the selected volume surrounding the bond pad 110 excluded by typical design rules has remained nearly constant, and the volume of the semiconductor die 100 that is available for active circuitry and metal components has been reduced. Thus, in accordance with one embodiment of the present invention, a bond pad capacitor 200 (see, e.g., FIG. 2A-B) deployed beneath the bond pad 110 is provided.

Figure 2A:
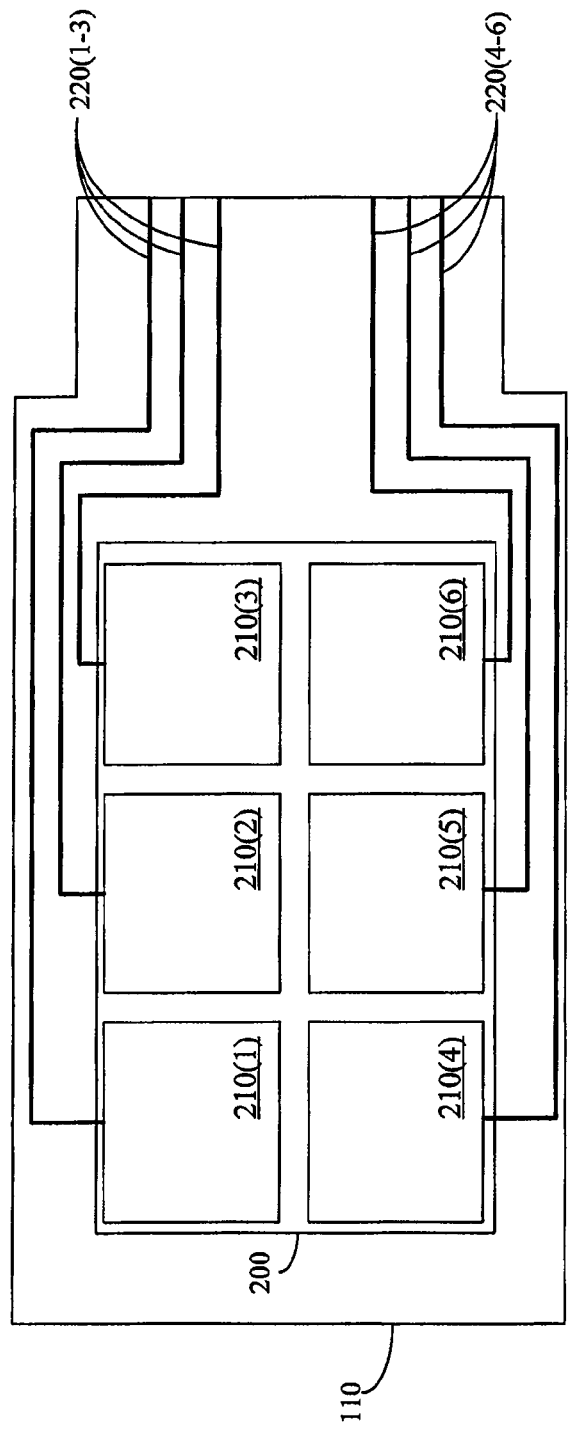
FIGS. 2A-B show a top-down view and a perspective side view, respectively, of a bond pad and a bond pad capacitor that may be used in the die shown in FIG. 1 in accordance with one embodiment of the present invention.

Referring now to FIG. 2A, a top-down view of one embodiment of the bond pad 110 and the bond pad capacitor 200 is shown. In one embodiment, the bond pad capacitor 200 is programmable. For example, as shown in FIG. 2A, the bond pad capacitor 200 is comprised of a plurality of capacitors 210(1-6). As discussed in detail below, the capacitance of the bond pad capacitor 200 may be varied by coupling one or more of the capacitors 210(1-6) to the internal circuit 120 using lines 220(1-6). Although six capacitors 210(1-6) and six lines 220(1-6) are shown in FIG. 2A, it will be appreciated that the present invention is not so limited. In alternative embodiments, more or fewer capacitors 210(1-6), as well as more or fewer lines 220(1-6), may be deployed without departing from the scope of the present invention.

Figure 2B:
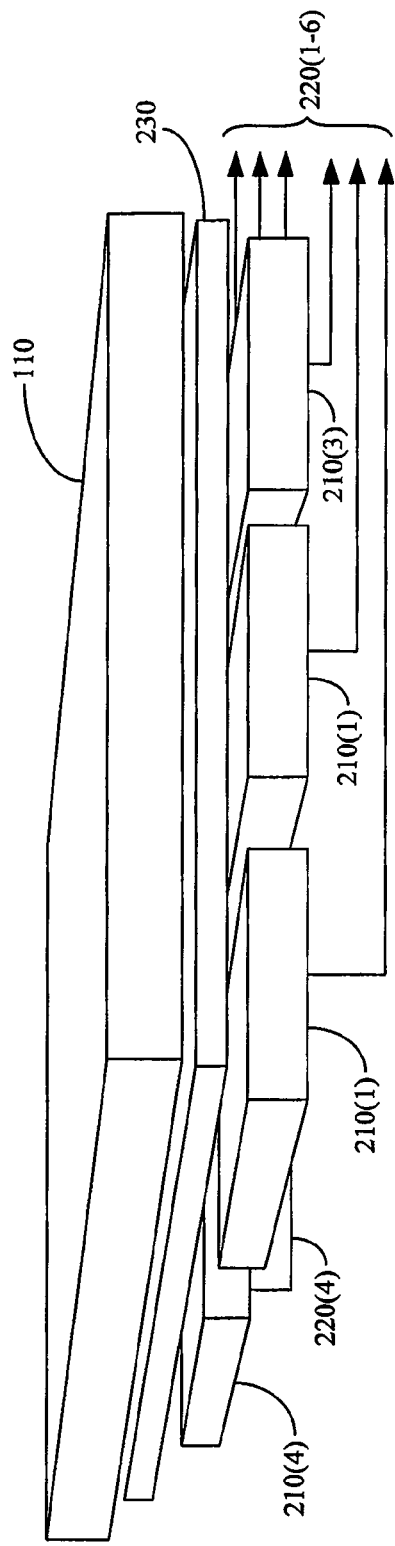

Referring now to FIG. 2B, a perspective side view of the bond pad 110 and the bond pad capacitor 200 is shown. In the illustrated embodiment, the capacitors 210(1-6) and the lines 220(1-6) that form the bond pad capacitor 200 are deployed beneath the bond pad 110. In the present application, the term "beneath" will be understood to imply that at least a first portion of the capacitors 210(1-6) is located beneath the bond pad 110. For example, substantially the entirety of each of the capacitors 210(1-6) may be deployed beneath the bond pad 110. However, it will be appreciated that, in alternative embodiments, a second portion of one or more of the capacitors 210(1-6) may extend beyond the boundaries of the bond pad 110 without departing from the scope of the present invention.

A separation layer 230 is also shown in FIG. 2B. In one embodiment, the separation layer 230 is deployed between the bond pad 110 and the bond pad capacitor 200. The separation layer 230 may absorb stresses that occur when the bond pad 110 is formed on the semiconductor die 100. For example, in one embodiment, the separation layer 230 is formed of a metal such as aluminium, copper, and the like. In one embodiment, the separation layer 230 may have a thickness ranging from about 5000-8000 Å. For example, the separation layer 230 may have a thickness of 6000 Å. For another example, in a second embodiment, the separation layer 230 may be formed of a variety of dielectric and/or insulating materials, including silicon dioxide, silicon nitride, silicon oxynitride, other oxides and oxynitrides, and the like.

For yet another example, the separation layer 230 may be formed of a combination of a metal and a dielectric and/or insulation material, without departing from the scope of the present invention. In one embodiment, the thickness of the dielectric separation layer 230 may be about 5000-8000 Å. For example, the thickness of the dielectric separation layer 230 may be about 5000 Å. Where the separation layer 230 is formed of a metal or other conducting material, insulating layers will typically be formed between the metal (or other conducting materials) and each of the bond pad 110 and the capacitor 200.

Figure 3A:
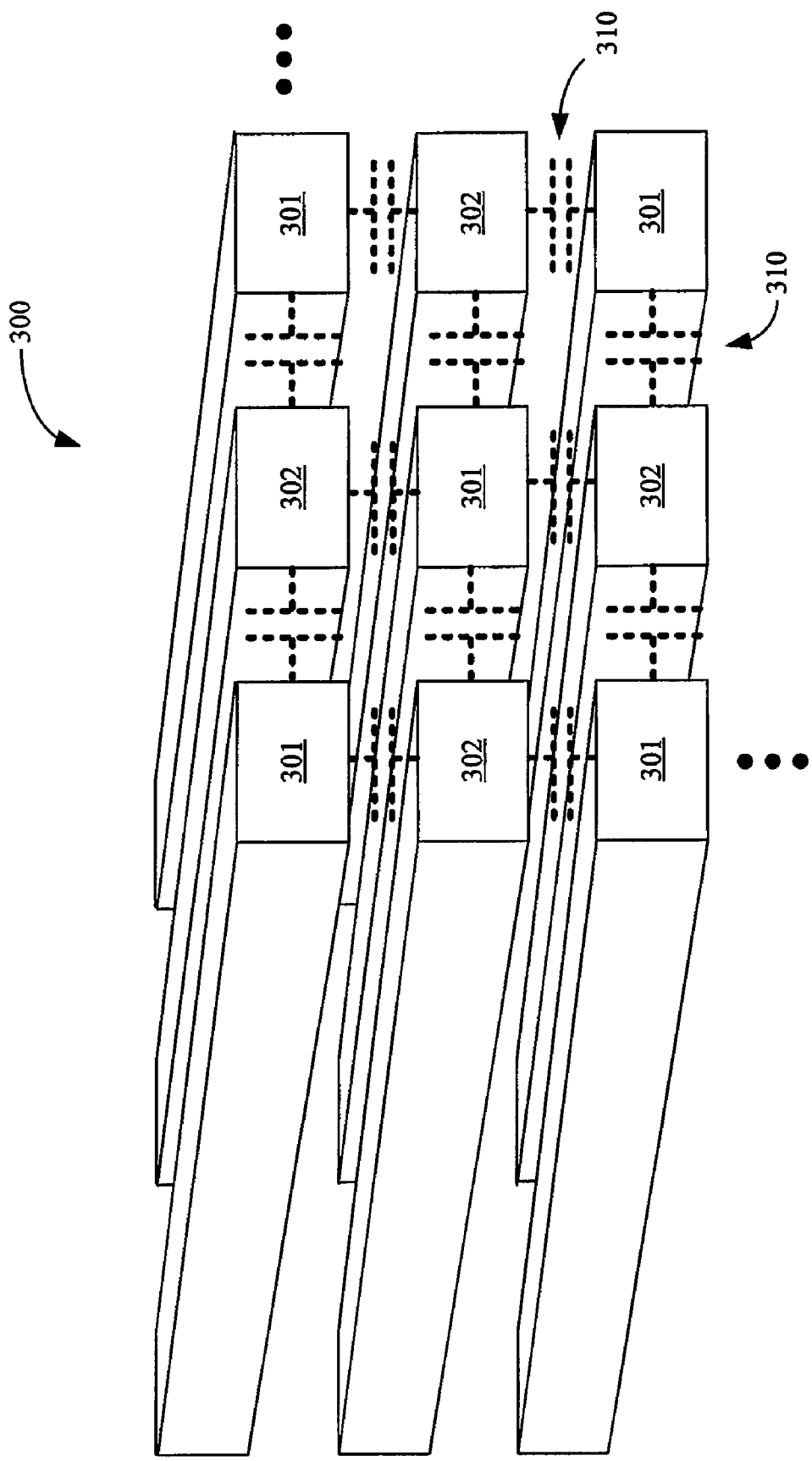
FIGS. 3A-B show a perspective side view and a top-down view, respectively, of an interdigitated capacitor that may be used in the bond pad capacitor shown in FIGS. 2A-B in accordance with one embodiment of the present invention.

FIG. 3A shows a perspective side view of one of the capacitors 210(1). In the illustrated embodiment, the capacitor 210 (1) is an interdigitated capacitor 300, which may be particularly resistant to the mechanical stress, thermal stress, and other stresses that may be created when the bond pad 110 is formed on the semiconductor die 100. The interdigitated capacitor 300 is comprised of a plurality of top plates 301 and a plurality of bottom plates 302. Capacitances 310, indicated by ghosted lines in FIG. 3A, are formed between each of the top and bottom plates 301, 302 of the interdigitated capacitor 300. As described in more detail below, the top plates 301 and the bottom plates 302 are linked such that the capacitances 310 combine to form a net capacitance of the interdigitated capacitor 300. Although five top plates 301 and four bottom plates 302 are shown in FIG. 3A, it will be appreciated that the number of top and bottom plates 301, 302 is a matter of design choice and is not material to the present invention. For example, in one embodiment, 17 top plates 301 and 17 bottom plates 302 are used to form the interdigitated capacitor 300 having the net capacitance of 200 femto-farads.

Figure 3B:
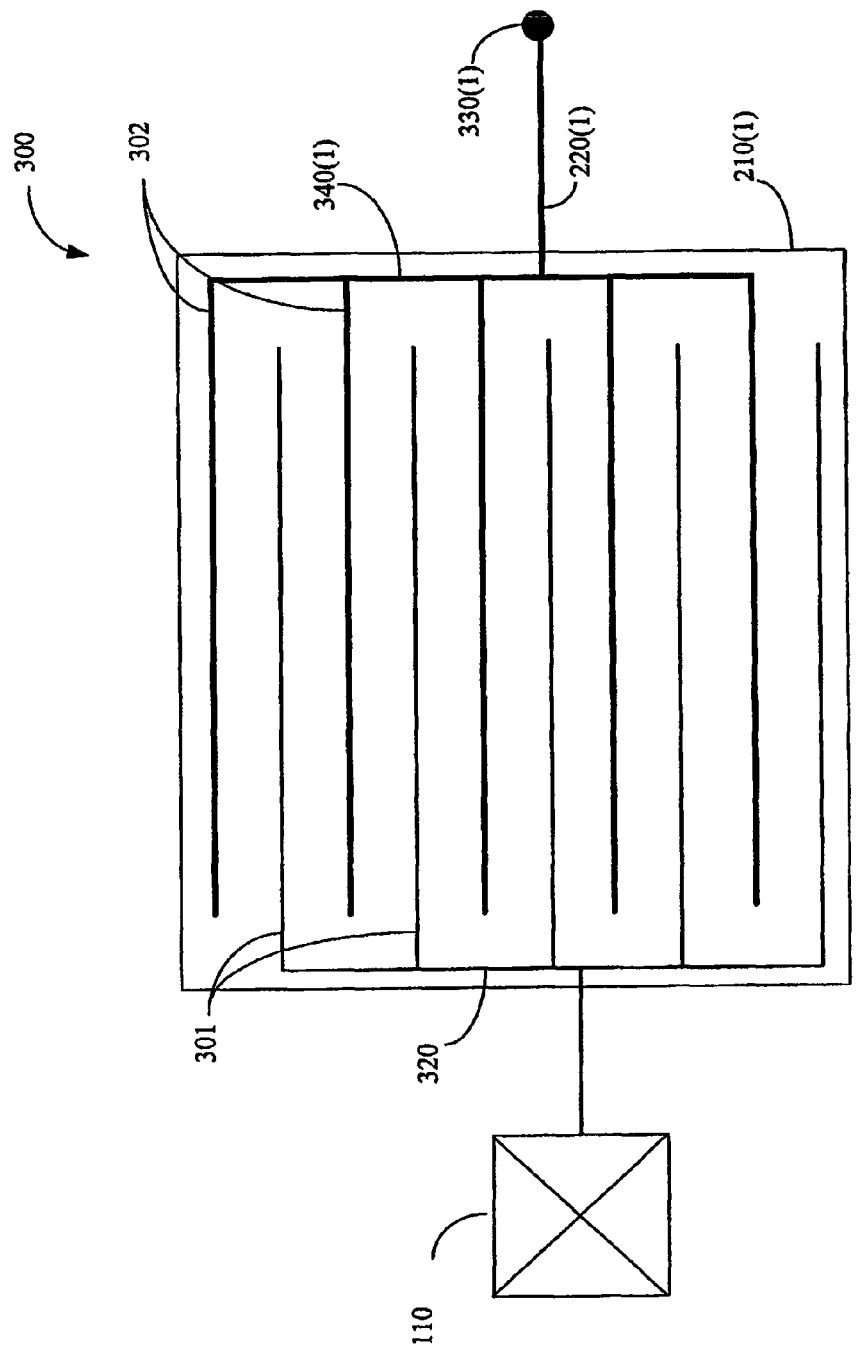

FIG. 3B shows a top view of the interdigitated capacitor 300 that may be used in the bond pad capacitor 200. In one embodiment, the plurality of top plates 301 are coupled to the bond pad 110 by a line 320, and the plurality of bottom plates 302 are coupled to a node 330(1) by a line 340(1), which is coupled to the line 220(1). The node 330(1) may be used to couple the interdigitated capacitor 300 to the internal circuit 120 (see FIG. 1). Although, in the illustrated embodiment, the capacitors 210(1-6) are interdigitated capacitors 300, it will be appreciated that, in alternative embodiments, the capacitors 210(1-6) may take any of a variety of desirable forms known to those of ordinary skill in the art. For example, the capacitors 210(1-6) may be formed of a single top plate 301 and a single bottom plate 302 separated by a dielectric (not shown). In alternative embodiments, the capacitors 210(1-6) may also be formed from vias (not shown) and the like.

The structure described above with reference to FIGS. 2A-B and 3A-B may be formed using well-known techniques including, but not limited to, deposition, masking, photolithography, etching, chemical-mechanical polishing, and the like. For example, the interdigitated capacitors 300 that comprise the bond pad capacitor 200 may be formed on a substrate (not shown) by depositing a first layer of dielectric material, forming a masking layer above the first dielectric layer, and using known photolithography and etching techniques to form etched regions in the first dielectric layer. The etched regions may then be filled with a conducting material and polished to form a first layer of the top and bottom plates 301, 302. A second dielectric layer may be formed above the first layer of top and bottom plates 301, 302. The aforementioned process may be repeated to form additional layers of top and bottom plates 301, 302 and dielectrics, as desired.

The separation layer 230 may be formed above the bond pad capacitor 200 by a variety of known techniques. For example, a metal separation layer 230 may be deposited over the bond pad capacitor 200, separated by a dielectric layer (not shown). The bond pad 110 may then be formed above the separation layer 230, separated by another dielectric layer (not shown) using a variety of known processes. For example, alternating layers of dielectric and metal (not shown) may be deposited and then a top metal layer (not shown) having a sufficient rigidity and thickness to cover bonding stress may be formed.

Figure 4:
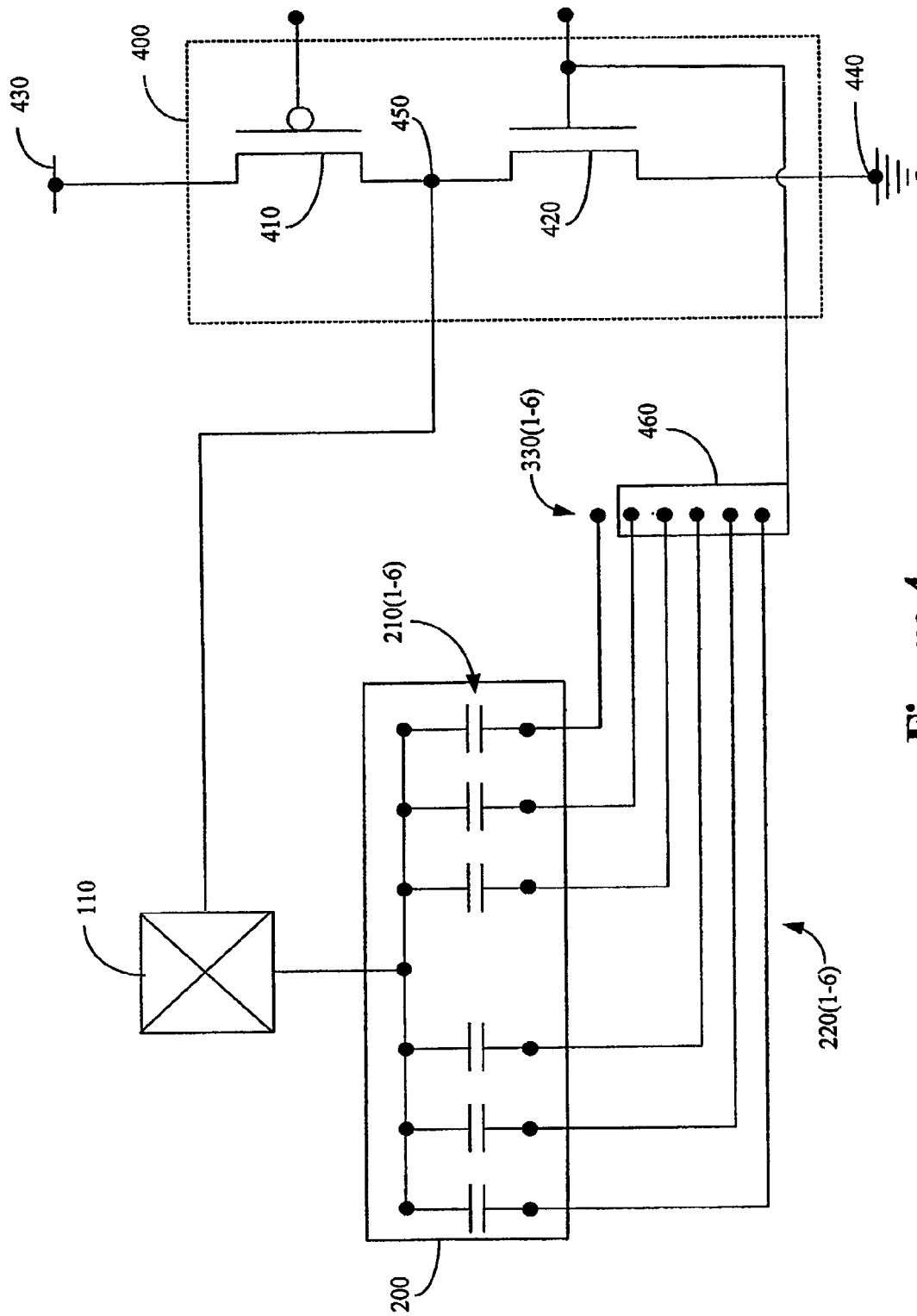
FIG. 4 shows a circuit diagram illustrating an I/O driver that may be coupled to the bond pad and the bond pad capacitor shown in FIGS. 2A-B, in accordance with one embodiment of the present invention.

FIG. 4 shows a circuit diagram that depicts an I/O driver 400 coupled to the bond pad 110 and the bond pad capacitor 200. In the illustrated embodiment, the I/O driver 400 is a CMOS I/O driver 400 comprised of a PMOS transistor 410 and an NMOS transistor 420. The transistors 410, 420 are coupled in series between a high voltage line 430 and a low voltage node 440, which is generally grounded. The bond pad 110 is also coupled to a node 450 that is between the transistors 410, 420.

To control a slew rate of the I/O driver 400, a gate of the NMOS transistor 420 is coupled to the nodes 330(1-6) of the bond pad capacitor 200 by a strip 460. In one embodiment, the capacitance of the bond pad capacitor 200 can be programmed by selecting a length of the strip 460. For example, as shown in the embodiment depicted in FIG. 4, the length of the strip 460 is selected to couple the I/O driver 400 to five of the nodes 330(1-6). The selected five of the capacitors 210(1-6) are then coupled in parallel. Thus, if each capacitor 210(1-6) has a capacitance of about 200 femto-farads, the net capacitance of the bond pad capacitor 200 in the illustrated embodiment is about 1000 femto-farads. Although the strip 460 is used to program the illustrated embodiment of the bond pad capacitor 200, the present invention is not so limited. In alternative embodiments, the I/O driver 400 may be coupled to one or more nodes 330(1-6) in any desirable manner without departing from the scope of the present invention.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A device comprising:
a bond pad configured to make an external electrical connection, wherein the bond pad is supported by a semiconductor substrate, and wherein a bond pad volume is defined in the semiconductor substrate proximate the bond pad;
a circuit component at least partially within the bond pad volume, wherein the circuit component comprises a plurality of capacitors;
a strip conductor configured to couple selected ones of the plurality capacitors together; and
a separation layer between the circuit component and the bond pad, wherein the separation layer is configured to absorb stress during formation of the external electrical connection.

2. The device of claim 1, wherein the separation layer comprises a metal layer.

3. The device of claim 1, wherein the separation layer comprises a dielectric layer.

4. The device of claim 1, wherein the separation layer comprises a combination of metal and dielectric materials.

5. The device of claim 1, wherein the separation layer has a thickness of about 5000-8000 Å.

6. The device of claim 1, wherein the separation layer has a thickness of about 5000 Å.

7. The device of claim 1, wherein the separation layer has a thickness of about 6000 Å.

8. The device of claim 1, wherein the plurality of capacitors comprise at least one interdigitated capacitor.

9. The device of claim 1, wherein at least one of the plurality of capacitors is not coupled to the selected ones.

10. The device of claim 1, wherein each of the plurality of capacitors has a capacitance of about 200 femto-farads.

11. The device of claim 1, further comprising an I/O driver circuit coupled to the strip conductor.

12. The device of claim 1, wherein the circuit component is coupled to the bond pad.

13. The device of claim 1, wherein the circuit component is coupled to a circuit component substantially outside of the bond pad volume.

14. An integrated circuit, comprising:
a bond pad having a region to which an external connection is bonded, wherein the bond pad is supported by a semiconductor substrate;
a circuit component in the semiconductor substrate at least partially beneath the bond pad, wherein the circuit component comprises a plurality of capacitors;
a strip conductor configured to couple selected ones of the plurality of capacitors together; and
a separation layer between the circuit component and the bond pad.

15. The integrated circuit of claim 14, wherein the plurality of capacitors comprises at least one interdigitated capacitor.

16. The integrated circuit of claim 14, wherein at least one of the plurality of capacitors is not coupled to the selected ones.

17. The integrated circuit of claim 14, further comprising an I/O driver coupled to the strip conductor.

18. The integrated circuit of claim 14, wherein the separation layer comprises a metal layer.

19. The integrated circuit of claim 14, wherein the separation layer comprises a dielectric layer.

20. The integrated circuit of claim 14, wherein the separation layer comprises a combination of metal and dielectric materials.

21. The integrated circuit of claim 14, wherein the separation layer has a thickness of about 5000-8000 Å.

22. The integrated circuit of claim 14, wherein the circuit component is coupled to the bond pad.

23. The integrated circuit of claim 14, wherein each of the plurality of capacitors has a capacitance of about 200 femto-farads.

24. An integrated circuit, comprising:
a bond pad;
a bond pad capacitor including a plurality of capacitors at least partially within the bond pad volume, and at least one separation layer between the plurality of capacitors and the bond pad;
a strip conductor coupled to the bond pad capacitor, wherein the strip conductor is programmable to couple together in parallel selected ones of the plurality of capacitors; and
an I/O driver comprising a PMOS transistor and a NMOS transistor, wherein the I/O driver is coupled to the bond pad and configured to be coupled to the bond pad capacitor.

25. A device comprising:
a bond pad having a region to which an external connection is bonded, wherein the bond pad is supported by a semiconductor substrate;
a circuit component in the semiconductor substrate at least partially beneath the bond pad, wherein the circuit component comprises at least one interdigitated capacitor; and
a separation layer between the circuit component and the bond pad.

* * * * *

UNITED STATES PATENT AND TRADEMARK OFFICE
CERTIFICATE OF CORRECTION

| | | |
|---|---|---|
| PATENT NO. | : 8,373,249 B2 | |
| APPLICATION NO. | : 13/012599 | |
| DATED | : February 12, 2013 | |
| INVENTOR(S) | : Sion C. Quinlan et al. | |

It is certified that error appears in the above-identified patent and that said Letters Patent is hereby corrected as shown below:

In the Claims:

In column 5, line 57, in Claim 1, after "plurality" insert -- of --.

Signed and Sealed this
Seventh Day of May, 2013

Teresa Stanek Rea
*Acting Director of the United States Patent and Trademark Office*